(12) United States Patent  
Sutardja

(10) Patent No.: US 7,808,834 B1
(45) Date of Patent: Oct. 5, 2010

(54) INCREMENTAL MEMORY REFRESH

(75) Inventor: Pantas Sutardja, Los Gatos, CA (US)

(73) Assignee: Marvell International Ltd., Hamilton (BM)

( * ) Notice: Subject to any disclaimer, the term of this patent is extended or adjusted under 35 U.S.C. 154(b) by 185 days.

(21) Appl. No.: 12/055,470

(22) Filed: Mar. 26, 2008

Related U.S. Application Data

(60) Provisional application No. 60/911,570, filed on Apr. 13, 2007.

(51) Int. Cl.
*G11C 16/06* (2006.01)

(52) U.S. Cl. ............................ 365/185.25; 365/185.11; 365/236

(58) Field of Classification Search ............ 365/185.25, 365/185.11, 236
See application file for complete search history.

(56) References Cited

U.S. PATENT DOCUMENTS

| | | | |
|---|---|---|---|
| 5,239,505 A | 8/1993 | Fazio et al. | |
| 5,574,684 A | 11/1996 | Tomoeda | |
| 6,396,744 B1 | 5/2002 | Wong | |
| 7,542,350 B2 * | 6/2009 | Park et al. | 365/185.24 |

OTHER PUBLICATIONS

U.S. Appl. No. 60/884,763, filed Jan. 12, 2004; "Improved Multi-Level Memory"; Pantas Sutardja; 36 pages.

* cited by examiner

*Primary Examiner*—Huan Hoang

(57) ABSTRACT

A memory system comprises charge storage cells and a refresh control module. The charge storage cells have a charge level decay that is based on lifetime erase operations performed on the charge storage cells. The refresh control module increases charge levels of the charge storage cells to offset the charge level decay without first erasing the charge storage cells. A method of controlling a memory system comprises determining charge level decay of charge storage cells having charge level decay characteristics that are based on lifetime erase operations performed on the charge storage cells; and increasing charge levels of the charge storage cells to offset the charge level decay without first erasing the charge storage cells.

42 Claims, 12 Drawing Sheets

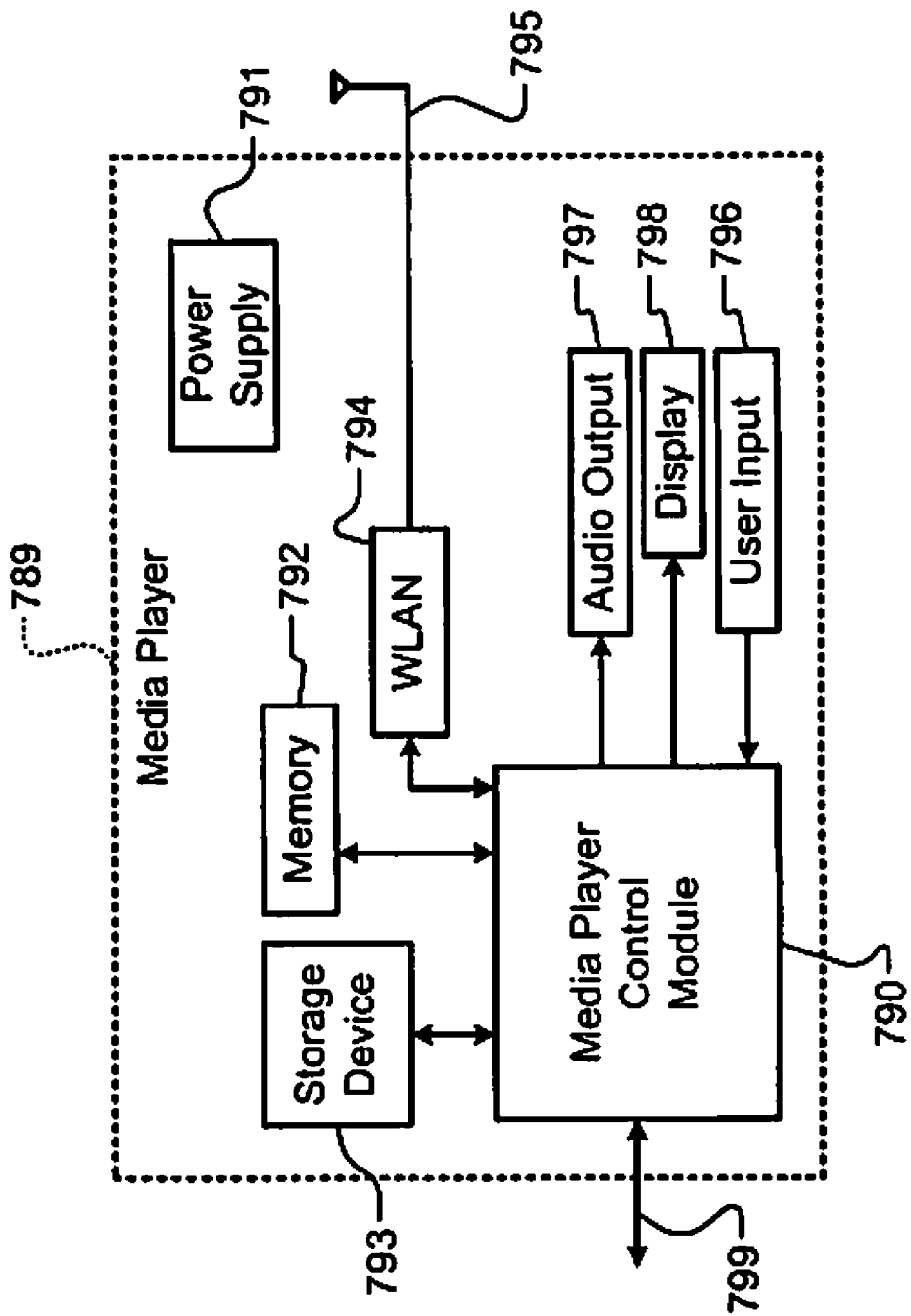

INCREMENTAL MEMORY REFRESH

CROSS-REFERENCE TO RELATED APPLICATIONS

This application claims the benefit of U.S. Provisional Applications No. 60/911,570, filed on Apr. 13, 2007. The disclosure of the above application is incorporated herein by reference in its entirety.

FIELD

The present disclosure relates to nonvolatile memory, and more specifically to maintaining data in nonvolatile memory.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Referring now to FIG. 1, a functional block diagram of an exemplary memory 50 is shown. Memory 50 includes a controller 52 and charge storage cells 54. Each of the charge storage cells 54 may be capable of storing a range of different charge levels. The range of charge levels may be segmented into two or more mutually exclusive regions. For example, a charge level below a threshold value may be considered an un-programmed state, while a charge level above the threshold value is considered a programmed state.

In some memory applications, two bits may be stored as four charge level regions. For example, a charge storage cell containing 25% or less of a maximum charge level may be considered to be in an un-programmed state. A charge level between 25% and 50% of the maximum charge level corresponds to a first programmed state, between 50% and 75% corresponds to a second programmed state, and between 75% and 100% corresponds to a third programmed state.

Changing the charge level causes a change in threshold voltage. The threshold voltage may be determined by measuring current when a given bias voltage is applied. The amount of current then indicates the charge level, and thus the programmed state. Programmed states may alternatively be defined by ranges of threshold voltages instead of by ranges of charge levels.

As programming and erasing operations are performed on certain ones of the charge storage cells 54, and as time passes, charge levels in others of the charge storage cells 54 may vary. For instance, programming one of the charge storage cells 54 may slightly impact the charge level of an adjacent one of the charge storage cells 54. Likewise, erasing may affect adjacent ones of the charge storage cells 54. Further, charge may leak with the passage of time, causing charge levels to decrease.

Referring now to FIG. 2, a flowchart depicts steps performed in refreshing the charge storage cells 54. The charge storage cells 54 may be periodically refreshed to maintain programmed charge levels. Control may begin upon power-on of the memory 50. Control begins in step 70, where a timer is started. Control continues in step 72, where control determines whether the timer period has expired. If the timer period has expired, control transfers to step 74; otherwise, control remains in step 72.

The timer period may be set to the minimum amount of time in which a charge level of one of the charge storage cells 54 could decay to the upper or lower boundary of its current programmed state. Beyond this period of time, the charge level of one of the charge storage cells 54 may shift from the current programmed state to another programmed state. To prevent this from happening, the charge storage cells 54 are refreshed before the expiration of the timer period.

In step 74, values from the charge storage cells 54 are read. Control continues in step 76, where the charge storage cells 54 are erased. Control continues in step 78, where the values originally read from the charge storage cells 54 are rewritten. Control continues in step 80, where the timer is reset. Control then returns to step 72.

The method of FIG. 2 is similar to that performed by a dynamic random access memory (DRAM) controller. In a DRAM controller, values are read out of memory cells before charge leakage could cause values to be read erroneously. For example, memory cells containing charge may leak to the point where they are indistinguishable from memory cells without charge. The read values are then reprogrammed into the memory cells, where they will be readable for another period of time. A refresh is performed after each time period.

SUMMARY

A memory system comprises charge storage cells and a refresh control module. The charge storage cells have a charge level decay that is based on lifetime erase operations performed on the charge storage cells. The refresh control module increases charge levels of the charge storage cells to offset the charge level decay without first erasing the charge storage cells.

The refresh control module tests one of the charge storage cells to determine a current charge level decay characteristic. The memory system further comprises nonvolatile memory that stores a count of lifetime erase operations performed on the charge storage cells. The count is used to determine at least one of the charge level decay characteristics. The charge storage cells are divided into blocks. The nonvolatile memory stores respective counts for each of the blocks. The memory system further comprises a wear leveling module that distributes data writes substantially uniformly across the charge storage cells. The count is a single count of lifetime erase operations used to determine the charge level decay characteristics for all of the charge storage cells.

The refresh control module increases a charge level of one of the charge storage cells by iteratively programming and verifying the one of the charge storage cells. The memory system further comprises a read/write module that programs the charge storage cells to M charge levels, wherein M is an integer greater than one. The read/write module programs one of the charge storage cells to one of the M charge levels by iteratively programming and verifying the one of the charge storage cells.

The refresh control module increases a charge level of one of the charge storage cells by selecting a corresponding one of the M charge levels based on a current charge level of the one of the charge storage cells and instructing the read/write module to program the one of the charge storage cells to the one of the M charge levels. The read/write module iteratively programs and verifies the one of the charge storage cells to reach the one of the M charge levels. The read/write module iteratively programs and verifies one of the charge storage cells to reach one of the M charge levels.

The refresh control module programs one of the charge storage cells with a first set of programming conditions. The first set of programming conditions is based on a time since the one of the charge storage cells was last programmed and on a charge level decay characteristic of the one of the charge storage cells. The first set of programming conditions includes a programming time that is based on the time since the one of the charge storage cells was last programmed and on the charge level decay characteristic of the one of the charge storage cells. The memory system further comprises a timer module that times a first period. The refresh control module selectively increases a charge level of one of the charge storage cells when the first period expires.

The first period is based on a count of lifetime erase operations performed on the one of the charge storage cells. The refresh control module tests one of the charge storage cells to determine a current charge level decay characteristic and the first period is based on the current charge level decay characteristic. The refresh control module increases charge levels of the charge storage cells when a refresh signal is received from a host. The refresh signal indicates at least one of that the memory system is receiving power from an external power supply and that the memory system is about to be removed from the external power supply.

The refresh control module increases charge levels of the charge storage cells when the memory system is idle. The refresh control module increases charge levels of the charge storage cells when a read performed on the charge storage cells indicates that at least a predetermined amount of charge level drift has occurred. The refresh control module tracks which groups of the charge storage cells are currently erased, and omits increasing charge levels of the groups. The memory system further comprises a read/write controller that erases a block of the charge storage cells including a first charge storage cell to erase the first charge storage cell.

A method of controlling a memory system comprises determining charge level decay of charge storage cells having charge level decay characteristics that are based on lifetime erase operations performed on the charge storage cells; and increasing charge levels of the charge storage cells to offset the charge level decay without first erasing the charge storage cells.

The method further comprises testing one of the charge storage cells to determine a current charge level decay characteristic. The method further comprises storing a count of lifetime erase operations performed on the charge storage cells. The count is used to determine at least one of the charge level decay characteristics. The charge storage cells are divided into blocks and the method further comprises storing respective counts for each of the blocks. The method further comprises distributing data writes substantially uniformly across the charge storage cells. The count is a single count of lifetime erase operations used to determine the charge level decay characteristics for all of the charge storage cells.

The method further comprises increasing a charge level of one of the charge storage cells by iteratively programming and verifying the one of the charge storage cells. The method further comprises programming the charge storage cells to M charge levels, wherein M is an integer greater than one. The method further comprises programming one of the charge storage cells to one of the M charge levels by iteratively programming and verifying the one of the charge storage cells.

The method further comprises increasing a charge level of one of the charge storage cells by selecting a corresponding one of the M charge levels based on a current charge level of the one of the charge storage cells and programming the one of the charge storage cells to the one of the M charge levels. The method further comprises iteratively programming and verifying the one of the charge storage cells to reach the one of the M charge levels. The method further comprises iteratively programming and verifying one of the charge storage cells to reach one of the M charge levels.

The method further comprises programming one of the charge storage cells with a first set of programming conditions. The first set of programming conditions is based on a time since the one of the charge storage cells was last programmed and on a charge level decay characteristic of the one of the charge storage cells. The first set of programming conditions includes a programming time that is based on the time since the one of the charge storage cells was last programmed and on the charge level decay characteristic of the one of the charge storage cells. The method further comprises timing a first period. The refresh control module selectively increases a charge level of one of the charge storage cells when the first period expires.

The first period is based on a count of lifetime erase operations performed on the one of the charge storage cells. The method further comprises testing one of the charge storage cells to determine a current charge level decay characteristic and the first period is based on the current charge level decay characteristic. The method further comprises increasing charge levels of the charge storage cells when a refresh signal is received from a host. The refresh signal indicates at least one of that power is being received from an external power supply and that power is about to be removed from the external power supply.

The method further comprises increasing charge levels of the charge storage cells during idle periods. The method further comprises increasing charge levels of the charge storage cells when a read performed on the charge storage cells indicates that at least a predetermined amount of charge level drift has occurred. The method further comprises tracking which groups of the charge storage cells are currently erased; and omitting increasing charge levels of the groups. The method further comprises erasing a block of the charge storage cells including a first charge storage cell to erase the first charge storage cell.

A memory system comprises charge storage means for storing levels of charge and having charge level decay that is based on lifetime erase operations performed on the charge storage means. The memory system also comprises refresh means for increasing charge levels of the charge storage means to offset the charge level decay without first erasing the charge storage means.

The refresh means tests one of the charge storage means to determine a current charge level decay characteristic. The memory system further comprises nonvolatile storage means for storing a count of lifetime erase operations performed on the charge storage means. The count is used to determine at least one of the charge level decay characteristics. The charge storage means are divided into blocks. The nonvolatile storage means stores respective counts for each of the blocks.

The memory system further comprises wear leveling means for distributing data writes substantially uniformly across the charge storage means. The count is a single count of lifetime erase operations used to determine the charge level decay characteristics for all of the charge storage means. The refresh means increases a charge level of one of the charge storage means by iteratively programming and verifying the one of the charge storage means. The memory system further comprises read/write means for programming the charge storage means to M charge levels, wherein M is an integer greater than one.

The read/write means programs one of the charge storage means to one of the M charge levels by iteratively programming and verifying the one of the charge storage means. The refresh means increases a charge level of one of the charge storage means by selecting a corresponding one of the M charge levels based on a current charge level of the one of the charge storage means and instructing the read/write means to program the one of the charge storage means to the one of the M charge levels. The read/write means iteratively programs and verifies the one of the charge storage means to reach the one of the M charge levels. The read/write means iteratively programs and verifies one of the charge storage means to reach one of the M charge levels.

The refresh means programs one of the charge storage means with a first set of programming conditions. The first set of programming conditions is based on a time since the one of the charge storage means was last programmed and on a charge level decay characteristic of the one of the charge storage means. The first set of programming conditions includes a programming time that is based on the time since the one of the charge storage means was last programmed and on the charge level decay characteristic of the one of the charge storage means. The memory system further comprises timing means for timing a first period. The refresh means selectively increases a charge level of one of the charge storage means when the first period expires.

The first period is based on a count of lifetime erase operations performed on the one of the charge storage means. The refresh means tests one of the charge storage means to determine a current charge level decay characteristic and the first period is based on the current charge level decay characteristic. The refresh means increases charge levels of the charge storage means when a refresh signal is received from a host. The refresh signal indicates at least one of that the memory system is receiving power from an external power supply and that the memory system is about to be removed from the external power supply.

The refresh means increases charge levels of the charge storage means when the memory system is idle. The refresh means increases charge levels of the charge storage means when a read performed on the charge storage means indicates that at least a predetermined amount of charge level drift has occurred. The refresh means tracks which groups of the charge storage means are currently erased, and omits increasing charge levels of the groups. The memory system further comprises read/write means for erasing a block of the charge storage means including a first charge storage means to erase the first charge storage means.

A computer program stored on a computer-readable medium for use by a processor for operating a memory system comprises determining charge level decay of charge storage cells having charge level decay characteristics that are based on lifetime erase operations performed on the charge storage cells; and increasing charge levels of the charge storage cells to offset the charge level decay without first erasing the charge storage cells.

The computer program further comprises testing one of the charge storage cells to determine a current charge level decay characteristic. The computer program further comprises storing a count of lifetime erase operations performed on the charge storage cells. The count is used to determine at least one of the charge level decay characteristics. The charge storage cells are divided into blocks and the computer program further comprises storing respective counts for each of the blocks. The computer program further comprises distributing data writes substantially uniformly across the charge storage cells. The count is a single count of lifetime erase operations used to determine the charge level decay characteristics for all of the charge storage cells.

The computer program further comprises increasing a charge level of one of the charge storage cells by iteratively programming and verifying the one of the charge storage cells. The computer program further comprises programming the charge storage cells to M charge levels, wherein M is an integer greater than one. The computer program further comprises programming one of the charge storage cells to one of the M charge levels by iteratively programming and verifying the one of the charge storage cells.

The computer program further comprises increasing a charge level of one of the charge storage cells by selecting a corresponding one of the M charge levels based on a current charge level of the one of the charge storage cells and programming the one of the charge storage cells to the one of the M charge levels. The computer program further comprises iteratively programming and verifying the one of the charge storage cells to reach the one of the M charge levels. The computer program further comprises iteratively programming and verifying one of the charge storage cells to reach one of the M charge levels.

The computer program further comprises programming one of the charge storage cells with a first set of programming conditions. The first set of programming conditions is based on a time since the one of the charge storage cells was last programmed and on a charge level decay characteristic of the one of the charge storage cells. The first set of programming conditions includes a programming time that is based on the time since the one of the charge storage cells was last programmed and on the charge level decay characteristic of the one of the charge storage cells. The computer program further comprises timing a first period. The refresh control module selectively increases a charge level of one of the charge storage cells when the first period expires.

The first period is based on a count of lifetime erase operations performed on the one of the charge storage cells. The computer program further comprises testing one of the charge storage cells to determine a current charge level decay characteristic and the first period is based on the current charge level decay characteristic. The computer program further comprises increasing charge levels of the charge storage cells when a refresh signal is received from a host. The refresh signal indicates at least one of that power is being received from an external power supply and that power is about to be removed from the external power supply.

The computer program further comprises increasing charge levels of the charge storage cells during idle periods. The computer program further comprises increasing charge levels of the charge storage cells when a read performed on the charge storage cells indicates that at least a predetermined amount of charge level drift has occurred. The computer program further comprises tracking which groups of the charge storage cells are currently erased; and omitting increasing charge levels of the groups. The computer program further comprises erasing a block of the charge storage cells including a first charge storage cell to erase the first charge storage cell.

In still other features, the systems and methods described above are implemented by a computer program executed by one or more processors. The computer program can reside on a computer readable medium such as but not limited to memory, nonvolatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 10G is a functional block diagram of a media player.

DETAILED DESCRIPTION

Figure 2:
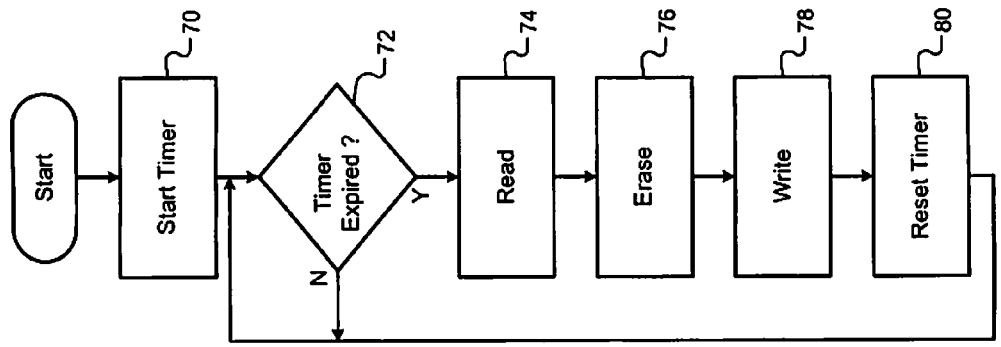
FIG. 2 is a flowchart depicting a memory refresh method according to the prior art.
Figure 1:
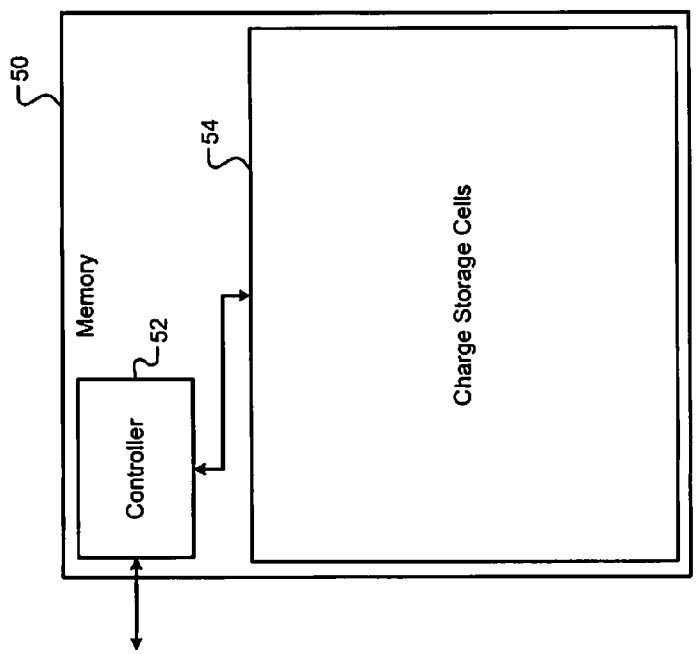
FIG. 1 is a functional block diagram of an exemplary memory according to the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Charge storage cells in a memory may be programmed to defined charge levels. Subsequent programming and erase operations to charge storage cells may cause charge levels of adjacent charge storage cells to drift. In addition, charge levels may gradually decrease or increase over time. If charge levels of charge storage cells primarily drift in one direction, and programming of the charge storage cells is performed in the opposite direction, incremental programming can counteract charge level drift.

Figure 4:
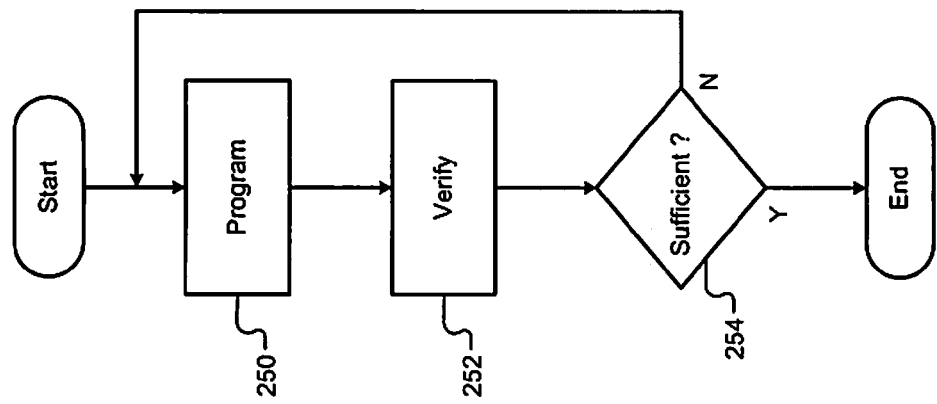
FIG. 4 is a flowchart depicting exemplary steps performed in a programming operation according to the principles of the present disclosure.

For example, if charge levels of charge storage cells generally decrease over time, and programming is performed by increasing charge levels, incremental programming can return drifting charge levels to programmed levels. FIG. 4 depicts how a charge storage cell may be programmed incrementally. The charge storage cell may be programmed incrementally from an erased state or from a charge level that has drifted away from the programmed charge level. As described in more detail below, this incremental programming, also called incremental refreshing, may be performed at certain times, such as periodically.

Charge level drift that occurs in both up and down directions may not be suitable to incremental programming. Charge storage cells within a nonvolatile memory may be capable of being programmed only in one direction. To decrease charge stored in such a charge storage cell, the charge storage cell may need to be completely erased to an erased state. Groups of charge storage cells, referred to hereinafter as blocks, may be erased simultaneously, making it difficult to incrementally decrease charge level in such charge storage cells.

Figure 5A:
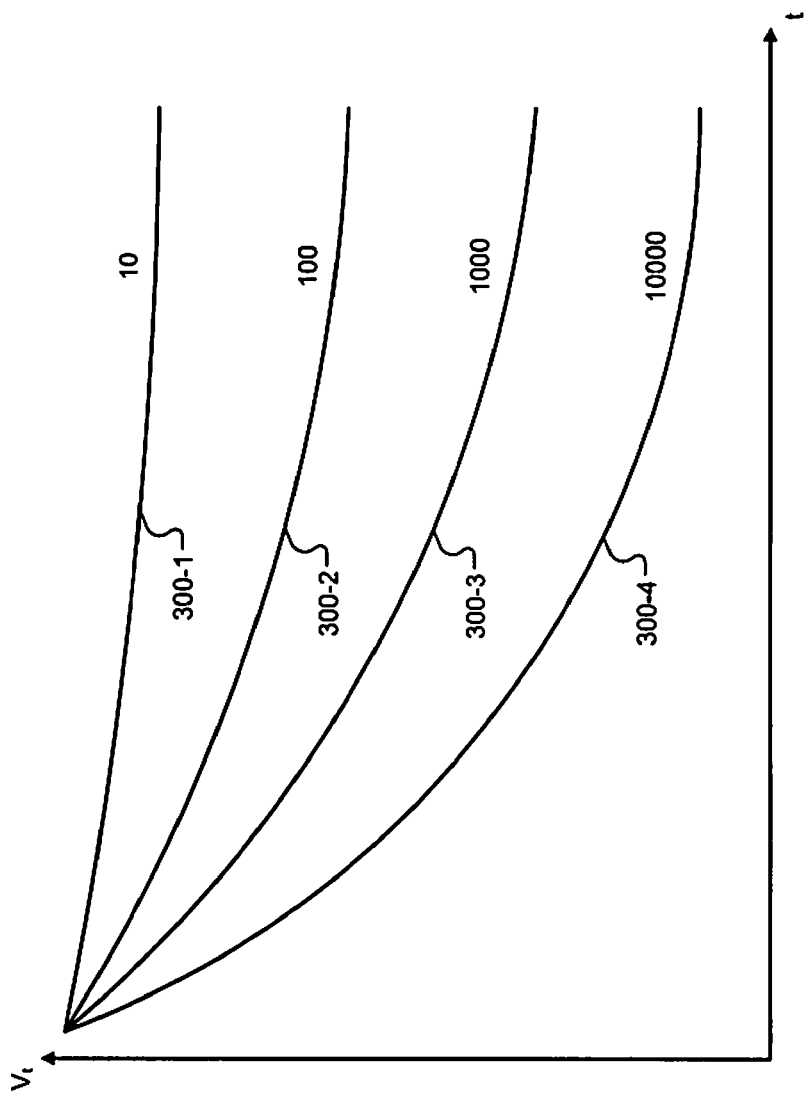
FIG. 5A is a graphical representation of exemplary decay characteristics of a charge storage cell.
Figure 5:
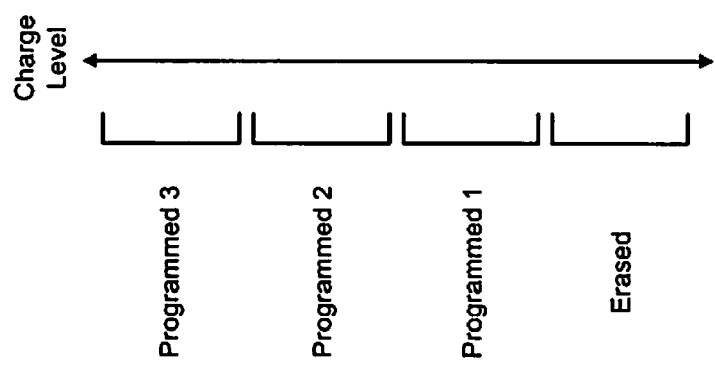
FIG. 5 is a graphical depiction of charge levels in a charge storage cell according to the principles of the present disclosure.
Figure 7:
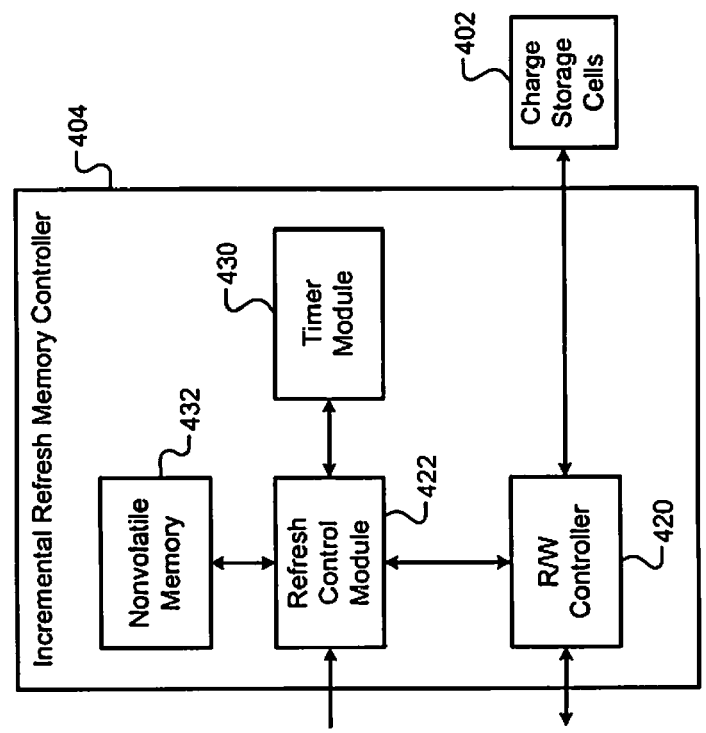
FIG. 7 is a functional block diagram of an incremental refresh memory controller according to the principles of the present disclosure.
Figure 6:
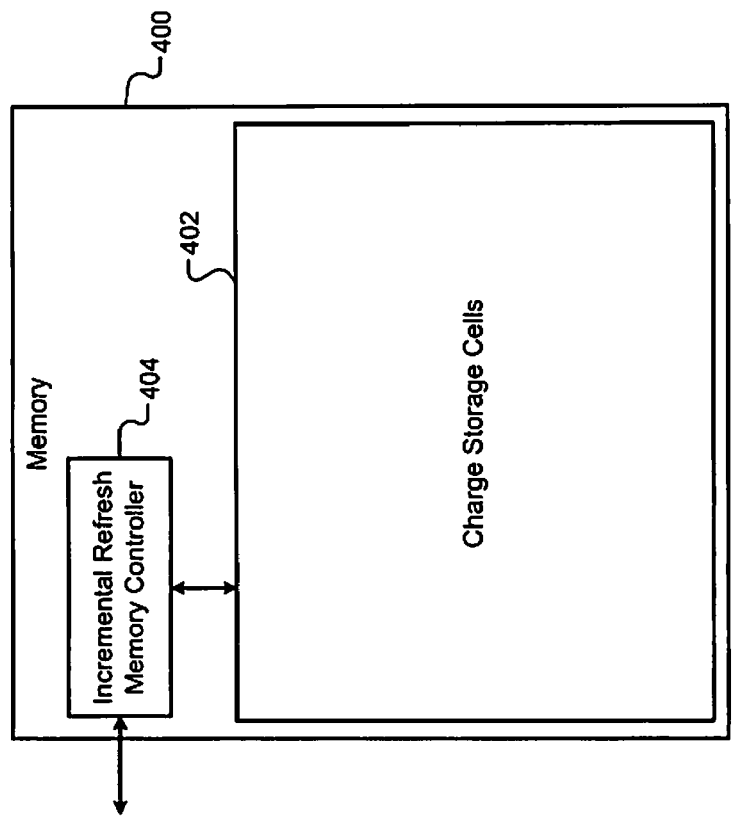
FIG. 6 is a functional block diagram of an exemplary memory according to the principles of the present disclosure.

Examples of charge levels and drift characteristics for charge storage cells whose charge levels primarily drift in one direction are shown in FIGS. 5 and 5A. An exemplary memory controller that uses incremental refreshing to counteract this unidirectional drift is shown in FIGS. 6 and 7. FIGS. 8, 8A, 9, and 9A depict exemplary control operation of the memory controller to determine when and how to incrementally refresh the charge storage cells.

Figure 3:
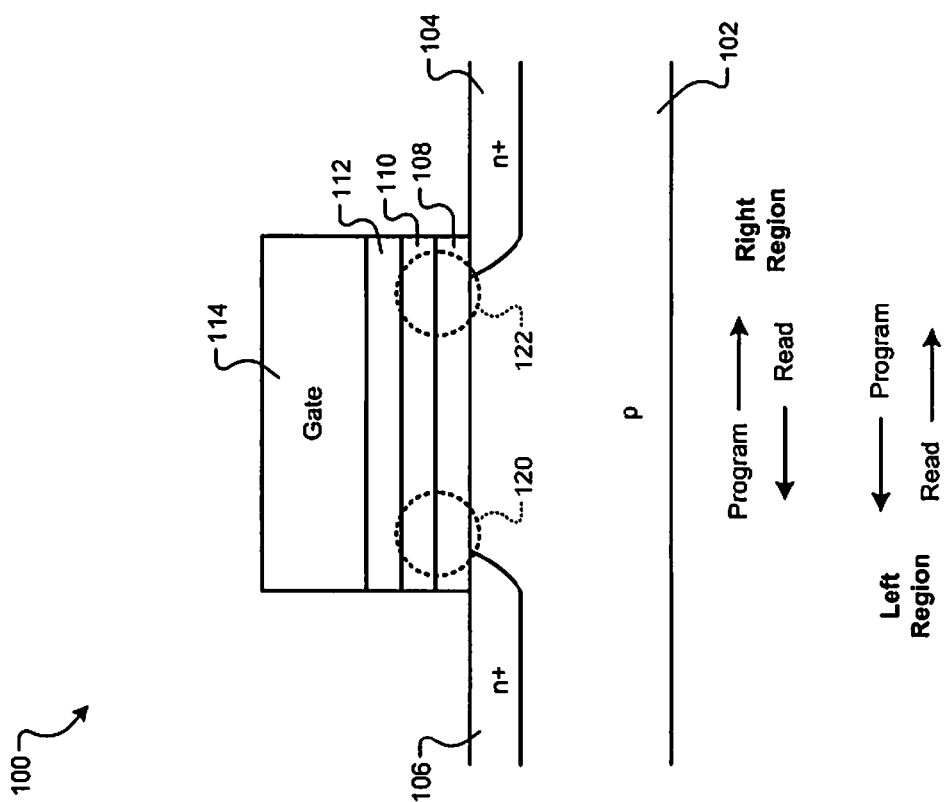
FIG. 3 is a cross-sectional view of a exemplary charge storage cell that can be programmed incrementally according to the principles of the present disclosure.

Referring now to FIG. 3, a cross-sectional view of an exemplary charge storage cell 100 is shown. For example only, the charge storage cell 100 may be nitride-based and may include a nitride read-only memory (NROM) transistor. The charge storage cell 100 may be referred to as a dual-edged memory charge storage cell.

The charge storage cell 100 includes a p-doped substrate 102 and a first n+ doped region ("right contact") 104, which can be used as a source or drain. The charge storage cell 100 also includes a second n+ doped region ("left contact") 106, which can be used as a drain or source. The charge storage cell 100 further includes a first gate dielectric layer 108, a trapping material (such as nitride) layer 110, a second gate dielectric layer 112, and a polysilicon gate 114. For example only, the doping of the left and right contacts 106 and 104 may be p+ and the substrate may be n-doped.

The charge storage cell 100 can store charge in two regions, generally depicted in FIG. 3 as two circular regions: a left region 120 and a right region 122. The amount of charge stored in the left and right regions 120 and 122 affects the threshold voltage of the charge storage cell 100, a property that can be used to store data.

Because the charge storage cell 100 is substantially symmetrical, the right and left contacts 104 and 106 can be used interchangeably as source and drain. To program the right region 122, a positive voltage is applied to the gate 114 and to the right contact 104, while the left contact 106 is held at ground. Electrons then travel from the left contact 106 to the right contact 104, and some gain sufficient energy to pass through the first gate dielectric layer 108 and become trapped in the nitride layer 110. The electrons are then trapped within the right region 122.

The charge trapped in the right region 122 has a measurable effect on the threshold voltage of the charge storage cell 100 when reading in a direction opposite to the programming direction. In other words, a voltage is applied to the gate 114 and to the left contact 106, while the right contact 104 is held at ground.

This voltage is generally less than the voltage used for programming the charge storage cell 100. The amount of current that then flows through the charge storage cell 100 is indicative of the threshold voltage of the charge storage cell 100 in the read direction, and thus of the amount of charge trapped in the right region 122.

The arrows below the charge storage cell 100 indicate the direction of flow of electrons during programming and reading operations for each of the left and right regions 120 and 122. The voltages for programming and reading are reversed for the left region 120. For instance, a program operation is performed for the right region 122 when electrons flow from the left contact 106 to the right contact 104. This is accomplished by holding the right contact 104 at a higher potential than the left contact 106.

A read of the right region 122 is performed by holding the left contact 106 at a higher potential so that electrons will flow to the left contact 106 during the read. For the left region 120, a program operation involves holding the left contact 106 at a higher potential than the right contact 104. A read of the left region 120 can be performed by holding the right contact 104 at a higher potential than the left contact 106.

Referring now to FIG. 4, a flowchart depicts exemplary steps performed in programming a charge storage cell, such as the charge storage cell 100 of FIG. 3. An iterative process can be used to ensure that the charge storage cell is accurately programmed to a correct charge level. In a charge storage cell with multiple charge storage locations or modes, the method of FIG. 4 may be applied to program each of the charge storage locations or modes individually. Control begins in step 250, where control applies programming conditions to the charge storage cell for a predetermined period of time. The programming conditions may include predetermined voltages and/or currents, which may be applied to various terminals of the charge storage cell 100.

Control continues in step 252, where control performs a verification function, such as a read, on the charge storage cell. The verification function may measure current that flows through the charge storage cell when a known voltage is applied. The measured current indicates the threshold voltage of the charge storage cell, which in turn indicates the charge level of the charge storage cell.

Control continues in step 254, where if the charge storage cell has reached the desired charge level, control ends; otherwise, control returns to step 250. Desired charge levels are discussed in more detail below with respect to FIG. 5. The programming iterations performed in step 250 may be made smaller for charge storage cells that can assume more programmed states, with correspondingly smaller charge level ranges.

If a programming iteration increases the charge level of the charge storage cell by too much, the charge storage cell may need to be erased. The entire block containing the charge storage cell may therefore need to be erased as well. The program iterations of step 250 may therefore program in smaller increments as the charge level of the charge storage cell approaches the desired charge level. The smaller increments may use a smaller voltage or current and/or a shorter time.

Referring now to FIG. 5, a graphical depiction of exemplary charge levels in a charge storage cell is presented. The charge level in a charge storage cell varies in a range between a minimum level and a maximum level. The charge level range may then be split into two or more regions. Programming the charge storage cell to one of the regions is used to store data. For example, in FIG. 5, the charge level range is divided into four regions, which can store two bits of data.

In the example of FIG. 5, the bottom charge level region may correspond to an erased state. Three more mutually exclusive ranges may correspond to first, second, and third programmed states. The various states may comprise equally-sized regions of charge levels. In various other implementations, the states may comprise four equally sized regions of the range of threshold voltages that result from the range of possible charge levels. Charge level regions based on threshold voltage regions may correspond to unequally-sized charge level regions.

If the charge level of a charge storage cell primarily shifts in a downward direction, the charge storage cell may be programmed nearly to the top of the charge level region. In this way, the charge level will have to decrease through the entire programmed charge level region before reaching the next charge level region. As the charge level nears the bottom of the charge level region, an incremental refresh can be performed on the charge storage cell to return the charge level to the top of the appropriate charge level region.

In various implementations, guard bands may be defined between the charge level regions. When the charge level of a charge storage cell reaches a guard band, data from the charge storage cell may be unreliable. If the charge level tends to decrease, the charge storage cell most likely was previously within the charge storage region above the guard band.

The charge storage cell may be programmed back to the charge storage region above the guard band. Finding a charge level within a guard band may indicate that the charge storage cell needs to be refreshed more often. A shorter refresh time may ensure that there is not enough time for the charge level to drift out of the programmed charge region and into a guard band.

Referring now to FIG. 5A, a graphical representation of exemplary decay characteristics for a charge storage cell is presented. The charge level of a charge storage cell may decrease over time. This decrease may be observed as a decrease in threshold voltage. Four plots 300-1, 300-2, 300-3, and 300-4 of threshold voltage ($V_t$) versus time (t) are presented. The plots 300 demonstrate the decay of charge level within charge storage cells after having been programmed to a certain programmed value.

The charge level of charge storage cells may decay faster and to a greater extent as the number of memory operations performed on the charge storage cells increases. For example, the charge level of a charge storage cell may decay faster based upon the number of erase cycles performed over the lifetime of the charge storage cell.

Plot 300-1 may correspond to 10 erase cycles having been performed over the lifetime of the charge storage cell, plot 300-2 may correspond to 100 erase cycles, plot 300-3 may correspond to 1,000 erase cycles, and 300-4 may correspond to 10,000 erase cycles. The lifetime number of erase cycles or other memory operations may therefore determine how often charge storage cells need to be refreshed to maintain their contents. If the charge storage cells are not refreshed often enough, their charge levels may decay from one programmed state to another, thus leading to incorrect data being read.

The time axis in FIG. 5A may correspond to hours, days, or longer or shorter periods. When the decay occurs over a longer period of time, the incremental refreshing needed to maintain the threshold voltage of the charge storage cells can be performed more infrequently. While FIG. 5A depicts plots 300 of threshold voltage versus time, similar plots can be made for charge level versus time.

Referring now to FIG. 6, a functional block diagram of an exemplary memory 400 is presented. The memory 400 includes charge storage cells 402 having a substantially unidirectional decay characteristic. For example, the charge level of the charge storage cells 402 may decrease over time. The charge storage cells 402 are written and read by an incremental refresh memory controller 404.

Reading multiple charge storage locations within a charge storage cell and reading charge storage cells within an array may be performed in a specified order. The specified order may be opposite to the order in which the charge storage locations were written. For further discussion, refer to commonly assigned application, "Improved Multi-Level Memory," U.S. Provisional Application No. 60/884,763, filed Jan. 12, 2007, which is incorporated herein by reference in its entirety. The incremental refresh memory controller 404 interfaces outside of the memory 400 with a host (not shown).

Referring now to FIG. 7, a functional block diagram of the incremental refresh memory controller 404 is presented. The incremental refresh memory controller 404 includes a read/write (R/W) controller 420 and a refresh control module 422. The R/W controller 420 interfaces with the host and with the charge storage cells 402.

The refresh control module 422 uses the R/W controller 420 to perform refresh functions on the charge storage cells 402. The refresh control module 422 may communicate with a timer module 430 and/or nonvolatile memory 432. Nonvolatile memory 432 may include any suitable type of nonvolatile memory, examples of which are given below with respect to FIGS. 10A-10G.

The timer module 430 includes one or more timers, which the refresh control module 422 uses to determine when refresh operations should be performed on the charge storage cells 402. The refresh control module 422 may also receive external signals, such as from the host, that assist in determining when to perform refresh operations.

For example, when the memory 400 is implemented in a mobile device, such as a mobile phone, the external signal may indicate that the mobile device has been connected to an external power source. The refresh control module 422 may perform a refresh operation based upon this external signal. The refresh control module 422 may also perform a refresh operation if an external signal indicates that the mobile device is about to be removed from external power.

The refresh control module 422 may store usage data within nonvolatile memory 432, such as the number of memory operations performed on the charge storage cells 402. The charge storage cells 402 may be divided into blocks, where erase operations are performed on the entire block. Usage data may be stored per block of the charge storage cells 402, and may include the number of erase operations performed per block. The usage data may be used by the refresh control module 422 to determine refresh timer values for the charge storage cells 402. For example, a greater usage value may correspond to a shorter timer value.

The refresh control module 422 may also receive data from the R/W controller 420 indicating which of the charge storage cells 402 currently contain data. The refresh control module 422 may then skip blocks not currently storing data during a refresh operation. The R/W controller 420 may implement a write balancing function so that erase operations are performed substantially uniformly across the charge storage cells 402. In such a case, the refresh control module 422 may store a single usage value for the average number of memory operations performed on the charge storage cells 402.

Figure 8:
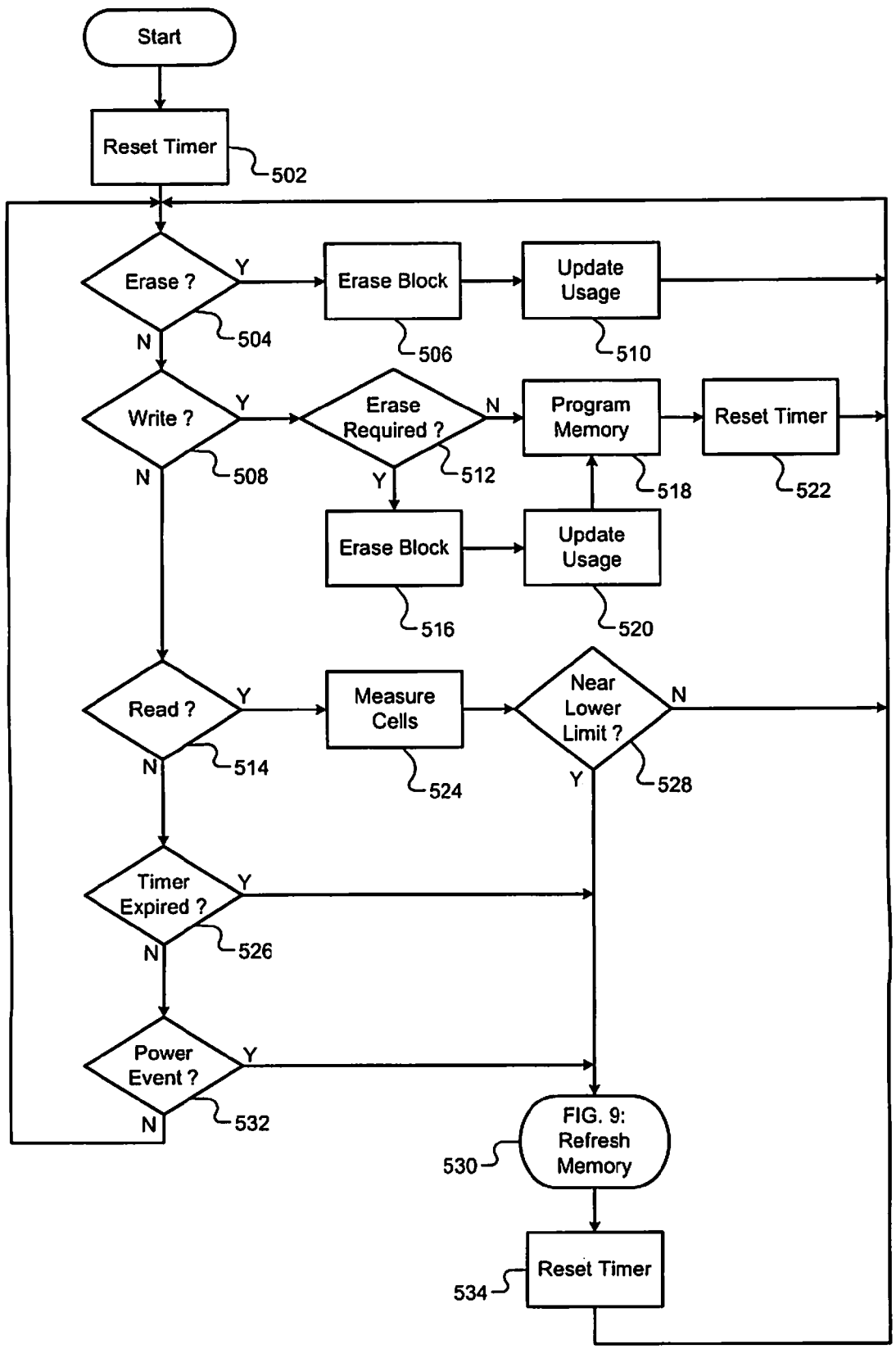
FIGS. 8-8A are flowcharts depicting exemplary steps performed by the incremental refresh memory controller according to the principles of the present disclosure.

Referring now to FIG. 8, a flowchart depicts exemplary steps performed by the incremental refresh memory controller 404. Control begins in step 502, where a timer is reset. The timer may stay in reset until a write is performed to charge storage cells. The timer may be powered even when the host device is powered down. In this way, the cumulative effects of charge leakage can be monitored, as charge leakage may occur even when the host device is powered off.

Control continues in step 504, where control determines whether an erase has been requested. If so, control transfers to step 506; otherwise, control transfers to step 508. In step 506, an erase operation is performed on the blocks containing the charge storage cells to be erased. If any data within the blocks to be erased should remain, it can be read prior to the erase operation. The data can then be re-programmed after the erase operation is performed.

Control continues in step 510, where control updates usage data for the erased blocks. For example, control may increment an erase count for each of the erased blocks. The erase count can be used to determine how fast the charge levels in the charge storage cells of the block will decrease. Usage data may also include a record of which blocks are currently storing data. Blocks not currently storing data may not need to be refreshed. Control then returns to step 504.

In step 508, control determines whether a write has been requested. If so, control transfers to step 512; otherwise, control transfers to step 514. In step 512, control determines whether an erase is required. If so, control transfers to step 516; otherwise, control transfers to step 518. An erase may be required if the charge storage cells to be written already contain data.

In step 516, the blocks to be written are erased. If any data within the blocks is not going to be overwritten, that data can be saved and rewritten after the erase is complete. Control continues in step 520, where control updates usage data for the blocks erased. Control then continues in step 518. In step 518, the values to be written are programmed into memory, such as by using the incremental method described with respect to FIG. 4.

Control continues in step 522, where a timer corresponding to the newly programmed blocks is reset. The timer is reset because the blocks have been freshly written. The timer should expire before any of the charge storage cells within freshly written blocks can decay from one programmed state to another. A timer may be provided for each block or for groups of blocks. If some blocks within a group of blocks have not been freshly written, the timer for the group of blocks may not be reset in step 522.

In step 514, control determines whether a read has been requested. If so, control transfers to step 524; otherwise, control transfers to step 526. In step 524, measurements are performed on the charge storage cells to be read. These measurements may include current and/or voltage readings, and may be used to determine the threshold voltages of the charge storage cells. Readings may be performed and calibrated as described in the above referenced application, "Improved Multi-Level Memory."

Control continues in step 528, where an optional verification step is performed. If a measurement of a charge storage cell indicates that the charge level of a charge storage cell is close to a lower boundary for one of the charge level regions, a refresh may be necessary. Further charge leakage may cause the charge storage cell to decay into a lower charge level region.

If the charge level of a charge storage cell is within a guard band, an error may be signaled. As described above, control may assume that the charge level of the charge storage cell has decayed from the charge level region above the guard band into the guard band. If one of the charge storage cells has decayed into a guard band, the timer value for the charge storage cell may need to be shorter.

Figures 9, 9A:
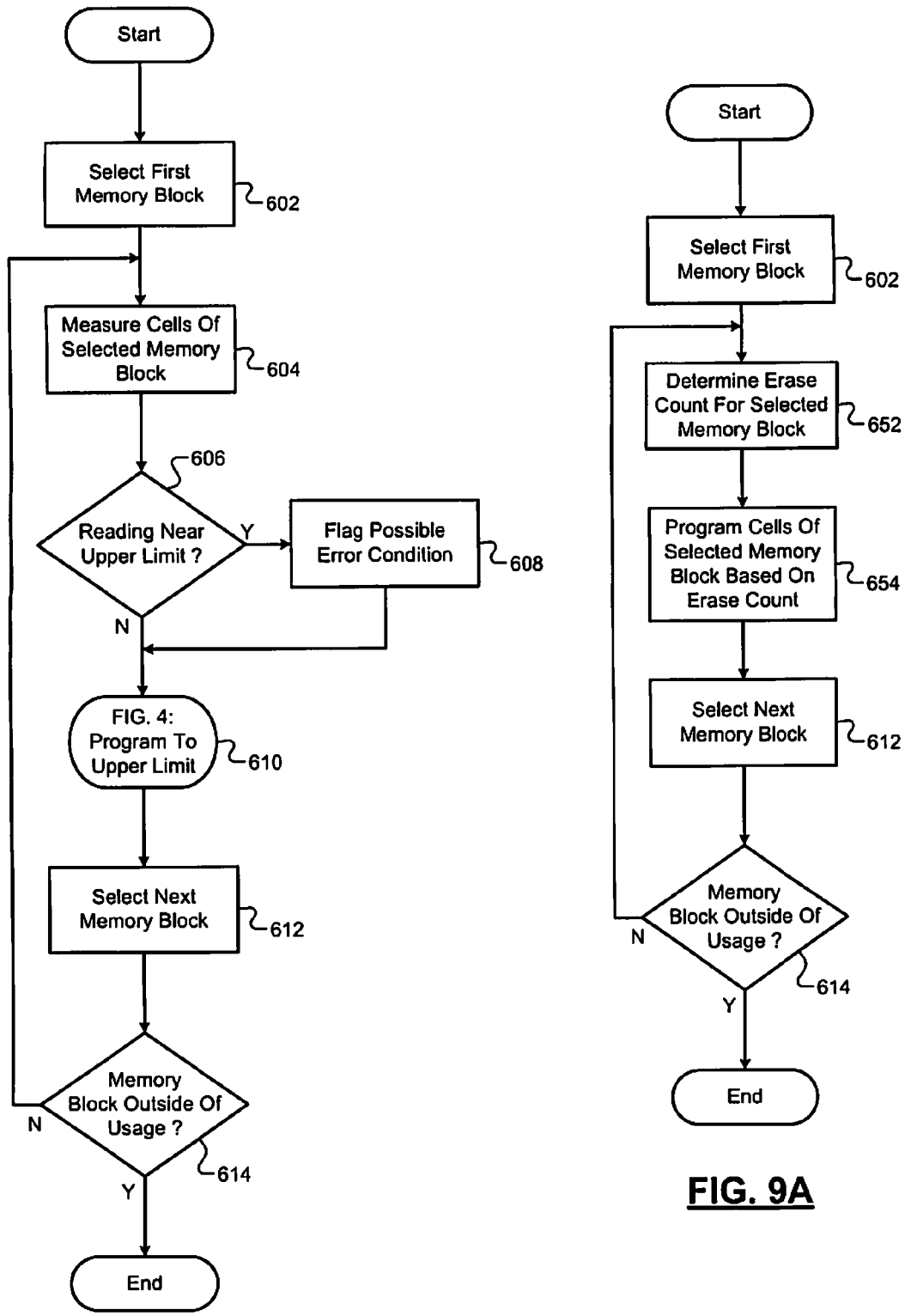
FIGS. 9-9A are flowcharts depicting exemplary methods of refreshing memory according to the principles of the present disclosure.

If the charge level of a charge storage cell is near a charge region lower limit or in a guard band, control transfers to step 530, where a memory refresh for those charge storage cells is performed according to FIG. 9. Otherwise, control returns to step 504. In step 526, if a timer has expired, control transfers to step 530, where a refresh is performed according to FIG. 9 for charge storage cells corresponding to that timer. Otherwise, control transfers to step 532.

In step 532, if control determines that a power event is outstanding, control transfers to step 530, where a refresh is performed according to FIG. 9 for all charge storage cells. Otherwise, control returns to step 504. Power events may include situations when the host is connected to an external power supply.

Power events may also include receiving a warning that the host will imminently be disconnected from the external power supply. In step 530, after performing a memory refresh according to FIG. 9, control transfers to step 534. In step 534, the timer(s) corresponding to the refreshed charge storage cells are reset, and control returns to step 504.

Figure 8A:
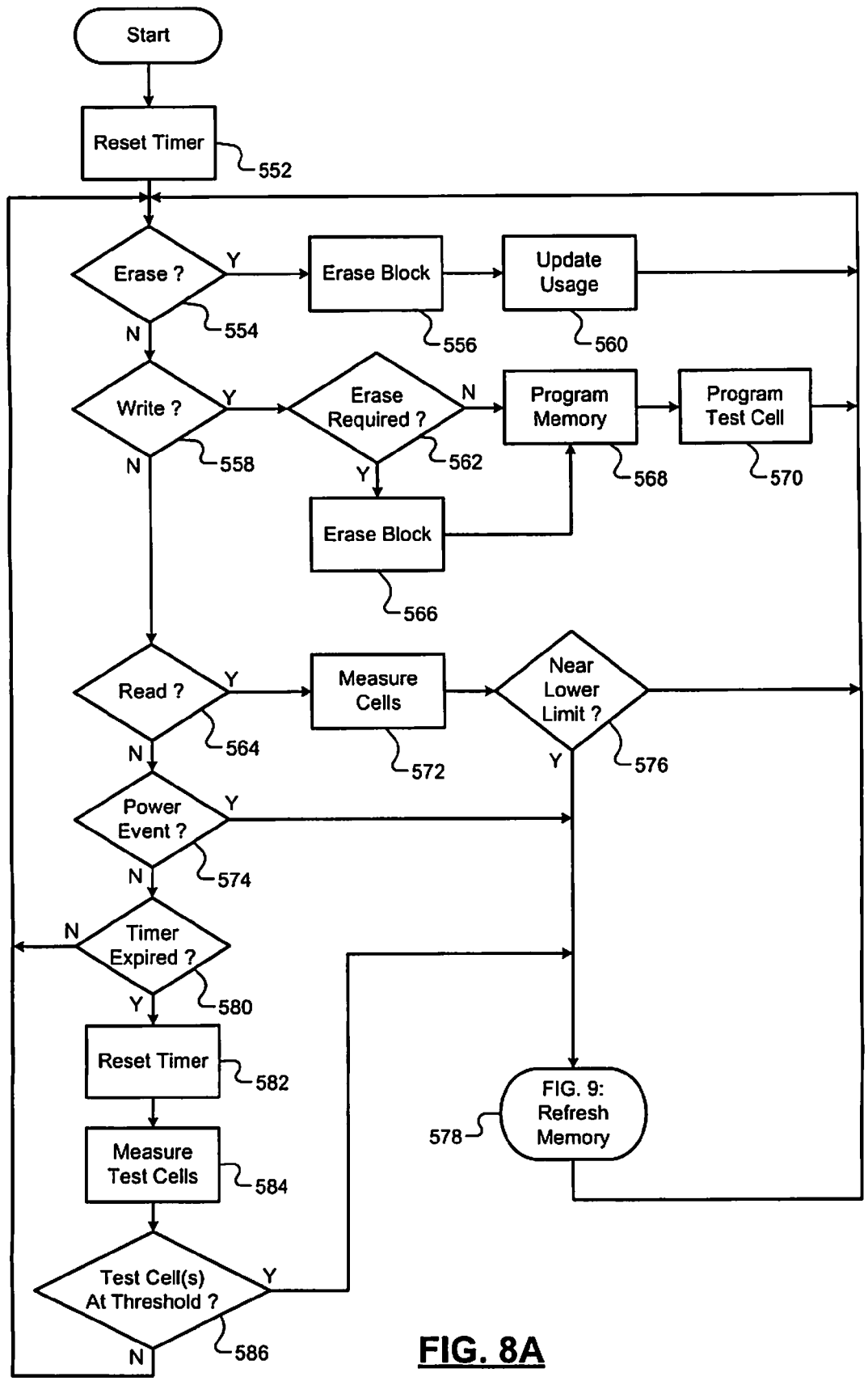

Referring now to FIG. 8A, a flowchart depicts another exemplary method implemented by the incremental refresh memory controller 404. Instead of using timers to determine when charge storage cells may need to be refreshed, the method of FIG. 8A analyzes the charge decay experienced by test cells. Timers may control how often the test cells are analyzed. Control begins in step 552, where such a timer is reset.

Control continues in step 554, where if an erase is requested, control transfers to step 556; otherwise, control transfers to step 558. In step 556, control erases the designated blocks. Control continues in step 560, where control updates usage data indicating that the blocks are no longer in use, and control returns to step 554. In step 558, control determines whether a write has been requested. If so, control transfers to step 562; otherwise, control transfers to step 564. In step 562, if an erase is required, control transfers to step 566; otherwise, control transfers to step 568.

In step 566, blocks are erased, and control continues in step 568. In step 568, the charge storage cells are programmed, and control transfers to step 570. In step 570, a test charge storage cell is programmed to a predetermined charge level. Because the starting charge level is known, control can determine how much charge leakage has occurred by measuring the charge level of the test charge storage cell.

The charge leakage experienced by the charge storage cell should be similar to that experienced by the charge storage cells written in step 568. Each block of charge storage cells may include one or more test charge storage cells in addition to charge storage cells used for storing user data. The test charge storage cells should have a similar decay characteristic to the rest of the block because each erase operation is performed on the entire block. Control then returns to step 554.

In step 564, control determines whether a read has been requested. If so, control transfers to step 572; otherwise, control transfers to step 574. In step 572, measurements are performed on the charge storage cells to be read. Control continues in step 576, where control may identify whether the measurements indicate that charge levels in charge storage cells are approaching a lower edge of a charge region or are in a guard band. If so, control transfers to step 578, where the identified charge storage cells are refreshed; otherwise, control returns to step 554.

In step 574, if a power event is pending, control transfers to step 578, otherwise, control transfers to step 580. In step 580, control determines whether the timer has expired. If so, control transfers to step 582; otherwise, control returns to step 554. In step 582, the timer is reset, and control continues in step 584. In step 584, test charge storage cells are measured. In various implementations, only those test charge storage cells corresponding to blocks that are in use, which may be indicated by the usage data, are measured.

Control continues in step 586, where control determines whether one or more of the measured test charge storage cells are below a threshold value. If a test charge storage cell is below a threshold value, indicating a certain amount of charge leakage, the test charge storage cell and other charge storage cells within the same block may need to be refreshed.

Threshold values may be determined for each charge level range, and may be a predetermined amount above the lower limit of the range. If any test charge storage cells are below the threshold, control transfers to step 578, where the corresponding blocks are refreshed. Otherwise, control returns to step 554. In step 578, selected blocks are refreshed according to FIG. 9, and control returns to step 554.

Referring now to FIG. 9, a flowchart depicts exemplary operation of the incremental refresh memory controller 404 when refreshing memory. Control begins in step 602, where the first memory block to be refreshed is selected. Control continues in step 604, where charge storage cells of the selected memory block are measured. Readings may be performed in a specified order and calibrated as described in the above referenced application, "Improved Multi-Level Memory."

Control continues in step 606, where control determines whether charge level measurements are near an upper end of one of the charge level regions. If so, control transfers to step 608; otherwise, control transfers to step 610. In step 608, an error condition may be flagged. Because a refresh often occurs after charge storage cells have decayed for a period of time, the charge level is expected to no longer be near the top of a charge level region.

The charge level may be the result of charge decay past the bottom of one charge level region into the top of the charge level region below. An error condition may not be present if the current refresh is due to a power event and is occurring soon after the charge storage cells were written. In such a case, an error condition may not be flagged. Control then continues in step 610.

In step 610, the charge storage cells of the selected memory block are incrementally programmed nearly to the upper limit of the current charge level range. This programming may take place according to FIG. 4. Control continues in step 612, where the next memory block to be refreshed is selected. Control then continues in step 614, where if the selected memory block is beyond the area of memory currently in use, control ends. Otherwise, control returns to step 604.

Referring now to FIG. 9A, a flowchart depicts exemplary operation of the incremental refresh memory controller 404 when refreshing memory. The method of FIG. 9 reads the current charge level in a charge storage cell and incrementally programs the charge storage cell to the desired charge level within the same charge region. However, because the rate of charge decay can be estimated for a charge storage cell based upon how many times the charge storage cell has been erased, a simplified method of refreshing can be used.

Instead of reading the charge level of the charge storage cell, the charge level may be increased by a specified amount. This amount may vary for each block based upon the number of erase cycles experienced by the block, and may vary based upon the amount of time since the block was last refreshed. The specified amount of programming may be defined by a specified voltage or specified current being applied to the charge storage cell. The specified amount of programming may also be defined by applying specified voltages and/or currents to the charge storage cell for a specified amount of time. For example only, the specified amount may be defined in terms of a number of programming iterations according to step 250 of FIG. 4.

In various implementations, a memory block may be refreshed using the method of FIG. 9 after the memory block has been refreshed using the method of FIG. 9A a predetermined number of times. This approach ensures that multiple refreshes performed according to FIG. 9A do not inadvertently increase charge levels of the charge storage cells past their programmed charge level regions. Alternatively, the refresh procedure of FIG. 9A may be used between refresh procedures performed according to FIG. 9.

Control begins in step 602, where the first memory block to be refreshed is selected. Control continues in step 652, where control determines the erase count for the selected memory block. The erase count indicates how fast charge will leak from the charge storage cells of the memory block. It may be assumed that erases have been performed approximately uniformly across the charge storage cells of the memory block.

Alternatively, erase counts may be maintained individually for each charge storage cell. In various implementations, other memory operations that affect charge degradation, such as programming procedures, may be tracked per charge storage cell or per memory block. If a wear leveling system is being used to distribute writes (and therefore erases) across the memory blocks of a memory, the erase count may be substantially similar for each of the memory blocks. In such a case, a single erase count may be stored for all memory blocks. The wear leveling system prevents one area of memory from being repeatedly programmed and erased while other areas remain unused or programmed to static values.

Control continues in step 654, where control programs cells of the selected memory block by a specified amount. The specified amount is based on the amount of time since the last refresh and the rate of charge decay as estimated by the erase count. The specified amount may correspond to a certain programming time and a certain programming intensity, such as current and/or voltage levels.

The amount of time and/or voltage/current levels for programming are estimated so as to return the charge level of the memory cells to their level before charge decay occurred. For example, a higher erase count for a memory block implies a faster charge decay rate, which can be offset by programming for a longer period of time. As a further example, a longer period of time since the last programming means that more charge will have leaked out, which can be offset by programming for a longer period of time.

Control continues in step 612, where the next memory block to be refreshed is selected. Control continues in step 614, where control determines whether the selected memory block is currently storing data. If not, the block does not need to be refreshed and control ends; otherwise, control returns to step 652. Step 614 may be modified to simply check for whether further memory blocks remain to be refreshed, and not whether the blocks are actually in use.

Figure 10A:
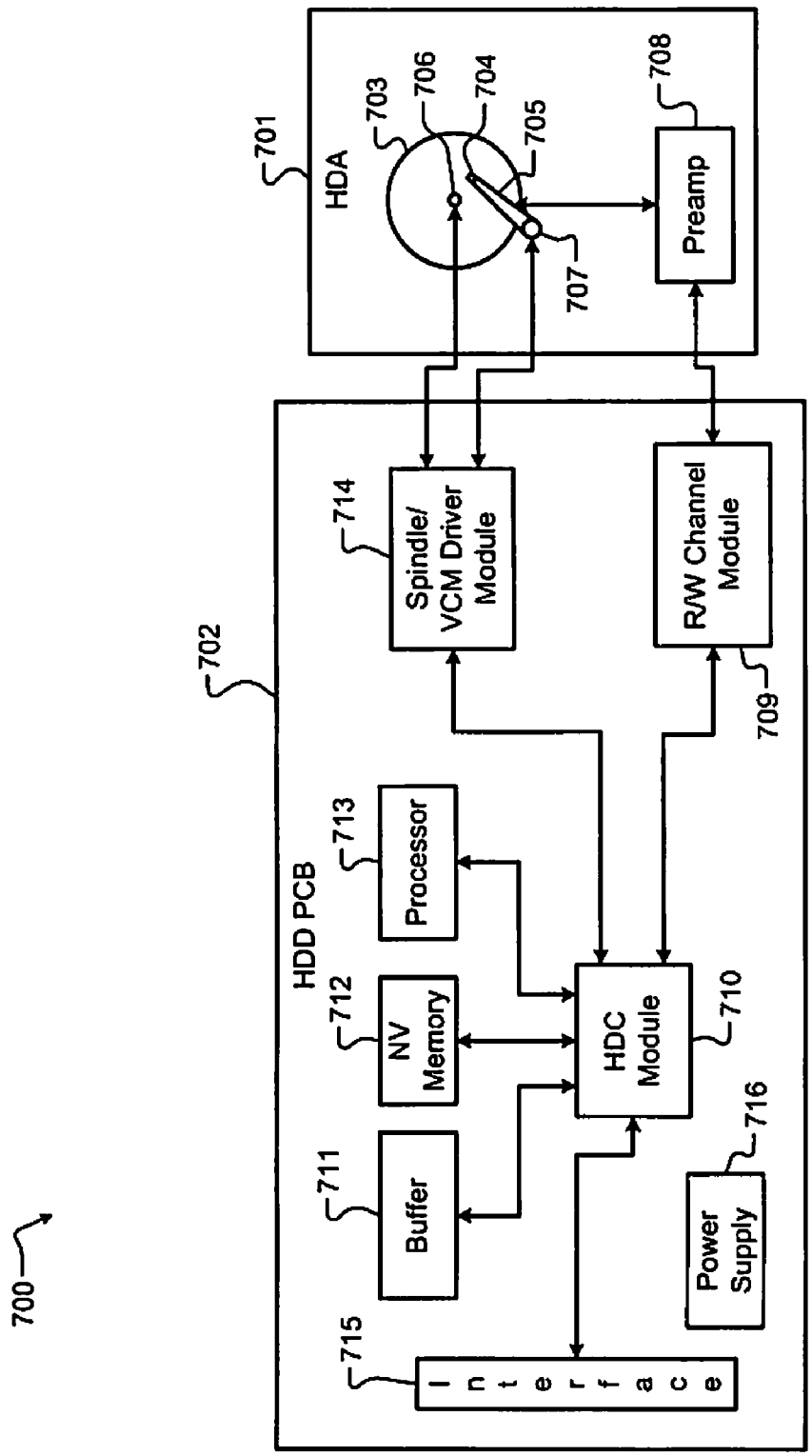
FIG. 10A is a functional block diagram of a hard disk drive.

Referring now to FIGS. 10A-10G, various exemplary implementations incorporating the teachings of the present disclosure are shown. Referring now to FIG. 10A, the teachings of the disclosure can be implemented in a buffer 711 or nonvolatile memory 712 of a hard disk drive (HDD) 700. The HDD 700 includes a hard disk assembly (HDA) 701 and a HDD PCB 702. The HDA 701 may include a magnetic medium 703, such as one or more platters that store data, and a read/write device 704.

The read/write device 704 may be arranged on an actuator arm 705 and may read and write data on the magnetic medium 703. Additionally, the HDA 701 includes a spindle motor 706 that rotates the magnetic medium 703 and a voice-coil motor (VCM) 707 that actuates the actuator arm 705. A preamplifier device 708 amplifies signals generated by the read/write device 704 during read operations and provides signals to the read/write device 704 during write operations.

The HDD PCB 702 includes a read/write channel module (hereinafter, "read channel") 709, a hard disk controller (HDC) module 710, the buffer 711, nonvolatile memory 712, a processor 713, and a spindle/VCM driver module 714. The read channel 709 processes data received from and transmitted to the preamplifier device 708.

The HDC module 710 controls components of the HDA 701 and communicates with an external device (not shown) via an I/O interface 715. The external device may include a computer, a multimedia device, a mobile computing device, etc. The I/O interface 715 may include wireline and/or wireless communication links.

The HDC module 710 may receive data from the HDA 701, the read channel 709, the buffer 711, nonvolatile memory 712, the processor 713, the spindle/VCM driver module 714, and/or the I/O interface 715. The processor 713 may process the data, including encoding, decoding, filtering, and/or formatting. The processed data may be output to the HDA 701, the read channel 709, the buffer 711, nonvolatile memory 712, the processor 713, the spindle/VCM driver module 714, and/or the I/O interface 715.

The HDC module 710 may use the buffer 711 and/or nonvolatile memory 712 to store data related to the control and operation of the HDD 700. The buffer 711 may include DRAM, SDRAM, etc. The nonvolatile memory 712 may include flash memory (including NAND and NOR flash memory), phase change memory, magnetic RAM, or multi-state memory, in which each memory charge storage cell has more than two states. The spindle/VCM driver module 714 controls the spindle motor 706 and the VCM 707. The HDD PCB 702 includes a power supply 716 that provides power to the components of the HDD 700.

Figure 10B:
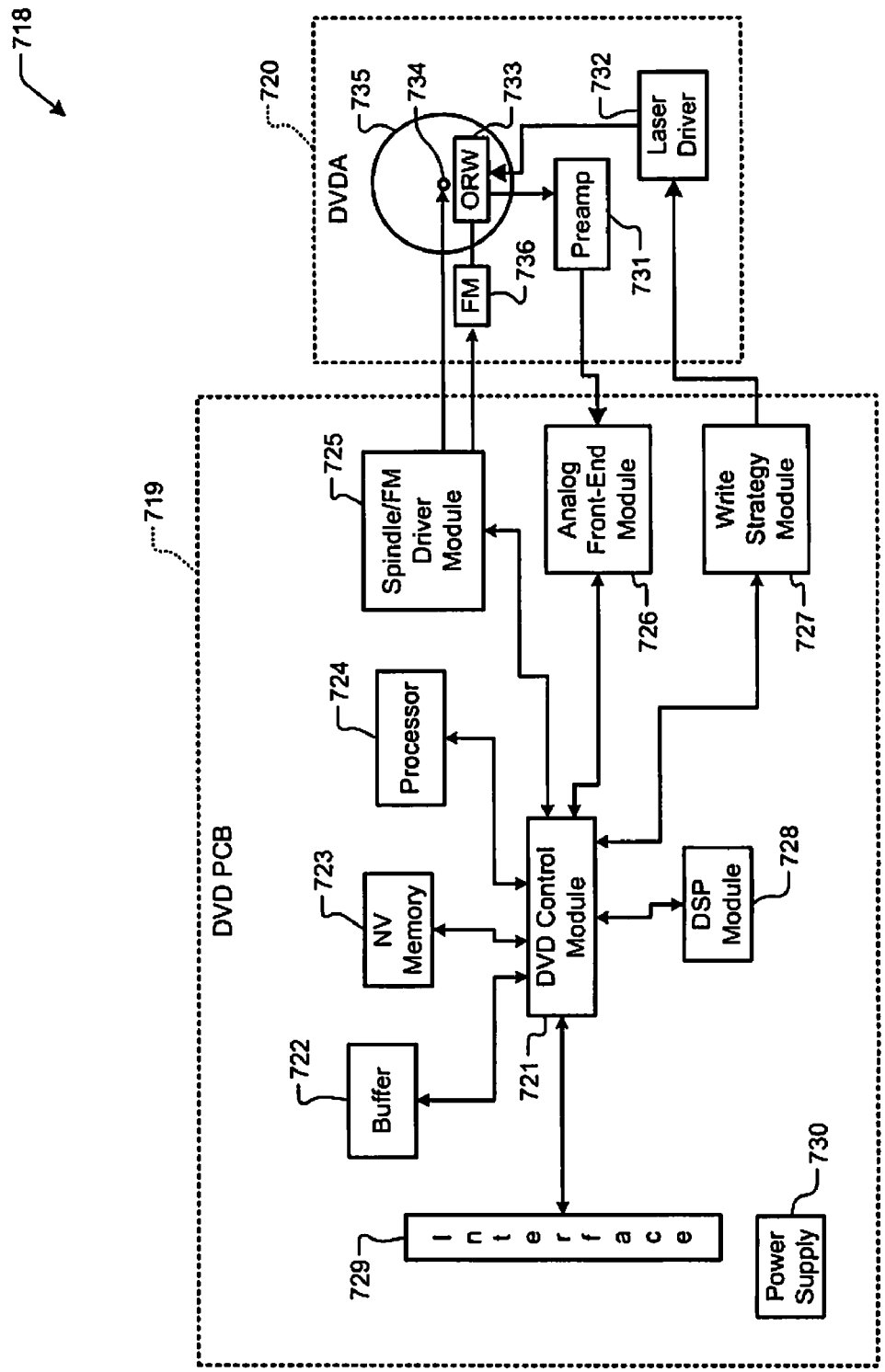
FIG. 10B is a functional block diagram of a DVD drive.

Referring now to FIG. 10B, the teachings of the disclosure can be implemented in a buffer 722 or nonvolatile memory 723 of a DVD drive 718 or of a CD drive (not shown). The DVD drive 718 includes a DVD PCB 719 and a DVD assembly (DVDA) 720. The DVD PCB 719 includes a DVD control module 721, the buffer 722, nonvolatile memory 723, a processor 724, a spindle/FM (feed motor) driver module 725, an analog front-end module 726, a write strategy module 727, and a DSP module 728.

The DVD control module 721 controls components of the DVDA 720 and communicates with an external device (not shown) via an I/O interface 729. The external device may include a computer, a multimedia device, a mobile computing device, etc. The I/O interface 729 may include wireline and/or wireless communication links.

The DVD control module 721 may receive data from the buffer 722, nonvolatile memory 723, the processor 724, the spindle/FM driver module 725, the analog front-end module 726, the write strategy module 727, the DSP module 728, and/or the I/O interface 729. The processor 724 may process the data, including encoding, decoding, filtering, and/or formatting.

The DSP module 728 performs signal processing, such as video and/or audio coding/decoding. The processed data may be output to the buffer 722, nonvolatile memory 723, the processor 724, the spindle/FM driver module 725, the analog front-end module 726, the write strategy module 727, the DSP module 728, and/or the I/O interface 729.

The DVD control module 721 may use the buffer 722 and/or nonvolatile memory 723 to store data related to the control and operation of the DVD drive 718. The buffer 722 may include DRAM, SDRAM, etc. The nonvolatile memory 723 may include flash memory (including NAND and NOR flash memory), phase change memory, magnetic RAM, or multi-state memory, in which each memory charge storage cell has more than two states. The DVD PCB 719 includes a power supply 730 that provides power to the components of the DVD drive 718.

The DVDA 720 may include a preamplifier device 731, a laser driver 732, and an optical device 733, which may be an optical read/write (ORW) device or an optical read-only (OR) device. A spindle motor 734 rotates an optical storage medium 735, and a feed motor 736 actuates the optical device 733 relative to the optical storage medium 735.

When reading data from the optical storage medium 735, the laser driver provides a read power to the optical device 733. The optical device 733 detects data from the optical storage medium 735, and transmits the data to the preamplifier device 731. The analog front-end module 726 receives data from the preamplifier device 731 and performs such functions as filtering and A/D conversion. To write to the optical storage medium 735, the write strategy module 727 transmits power level and timing information to the laser driver 732. The laser driver 732 controls the optical device 733 to write data to the optical storage medium 735.

Figure 10D:
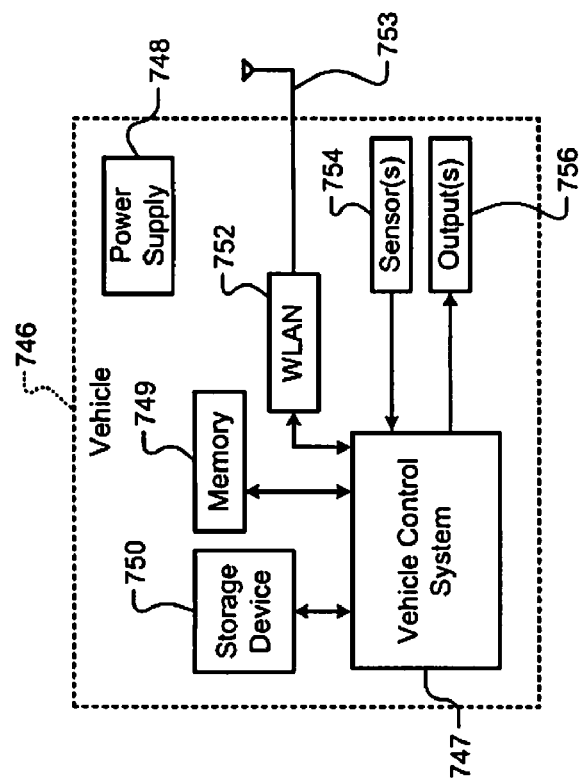
FIG. 10D is a functional block diagram of a vehicle control system.
Figure 10C:
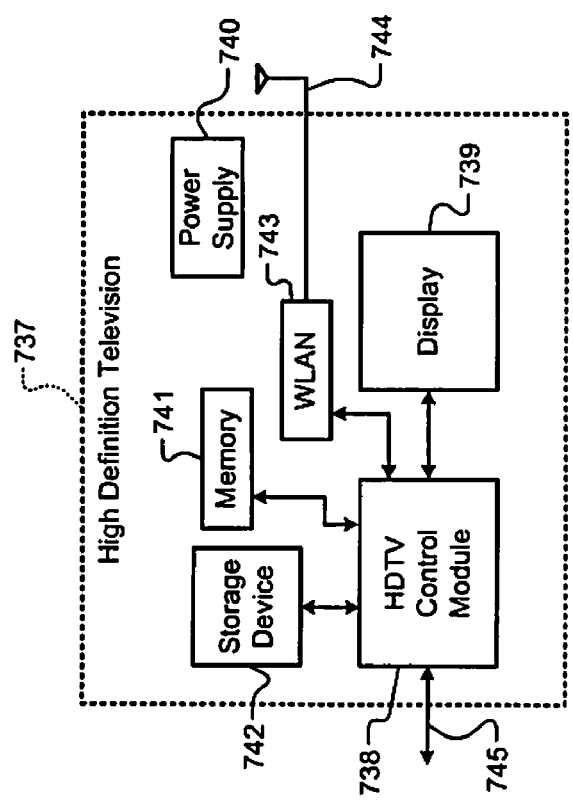
FIG. 10C is a functional block diagram of a high definition television.

Referring now to FIG. 10C, the teachings of the disclosure can be implemented in memory 741 of a high definition television (HDTV) 737. The HDTV 737 includes a HDTV control module 738, a display 739, a power supply 740, memory 741, a storage device 742, a WLAN interface 743 and associated antenna 744, and an external interface 745.

The HDTV 737 can receive input signals from the WLAN interface 743 and/or the external interface 745, which sends and receives information via cable, broadband Internet, and/or satellite. The HDTV control module 738 may process the input signals, including encoding, decoding, filtering, and/or formatting, and generate output signals. The output signals may be communicated to one or more of the display 739, memory 741, the storage device 742, the WLAN interface 743, and the external interface 745.

Memory 741 may include random access memory (RAM) and/or nonvolatile memory such as flash memory, phase change memory, or multi-state memory, in which each memory charge storage cell has more than two states. The storage device 742 may include an optical storage drive, such as a DVD drive, and/or a hard disk drive (HDD). The HDTV control module 738 communicates externally via the WLAN interface 743 and/or the external interface 745. The power supply 740 provides power to the components of the HDTV 737.

Referring now to FIG. 10D, the teachings of the disclosure may be implemented in memory 749 of a vehicle 746. The vehicle 746 may include a vehicle control system 747, a power supply 748, memory 749, a storage device 750, and a WLAN interface 752 and associated antenna 753. The vehicle control system 747 may be a powertrain control system, a body control system, an entertainment control system, an anti-lock braking system (ABS), a navigation system, a telematics system, a lane departure system, an adaptive cruise control system, etc.

The vehicle control system 747 may communicate with one or more sensors 754 and generate one or more output signals 756. The sensors 754 may include temperature sensors, acceleration sensors, pressure sensors, rotational sensors, airflow sensors, etc. The output signals 756 may control engine operating parameters, transmission operating parameters, suspension parameters, etc.

The power supply 748 provides power to the components of the vehicle 746. The vehicle control system 747 may store data in memory 749 and/or the storage device 750. Memory 749 may include random access memory (RAM) and/or nonvolatile memory such as flash memory, phase change memory, or multi-state memory, in which each memory charge storage cell has more than two states. The storage device 750 may include an optical storage drive, such as a DVD drive, and/or a hard disk drive (HDD). The vehicle control system 747 may communicate externally using the WLAN interface 752.

Figure 10F:
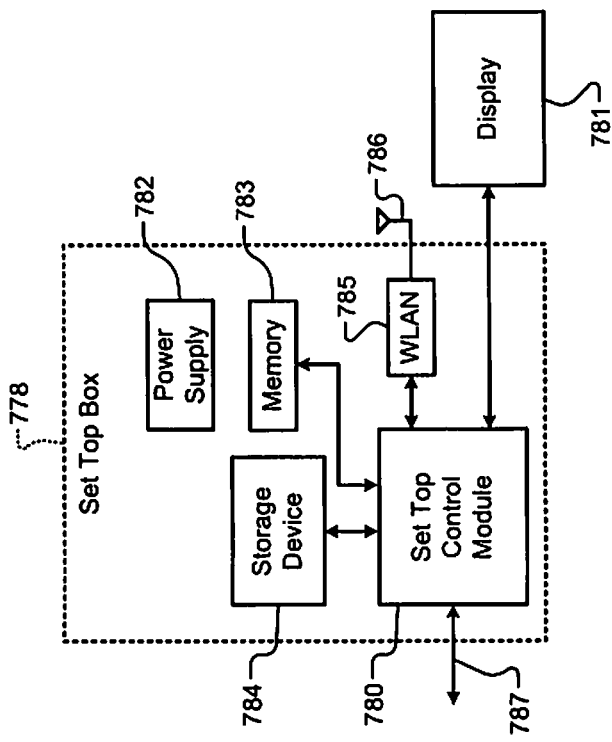
FIG. 10F is a functional block diagram of a set top box.
Figure 10E:
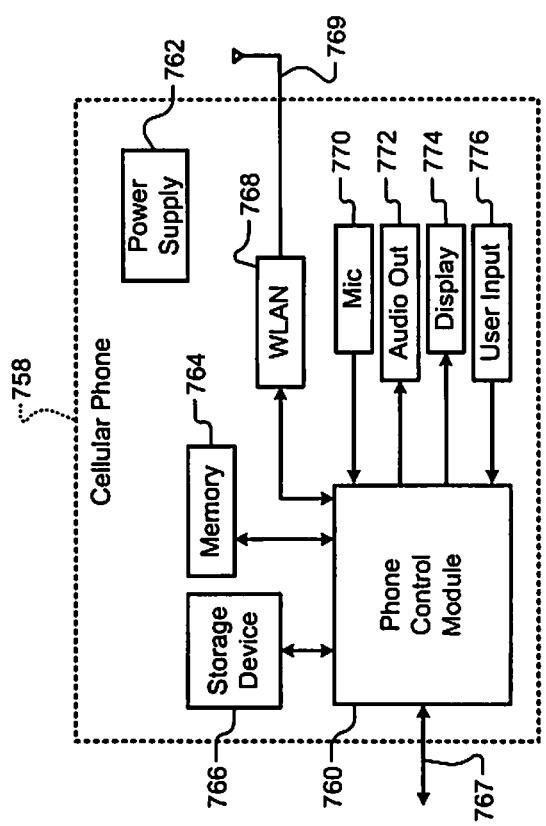
FIG. 10E is a functional block diagram of a charge storage cellular phone.

Referring now to FIG. 10E, the teachings of the disclosure can be implemented in memory 764 of a charge storage cellular phone 758. The charge storage cellular phone 758 includes a phone control module 760, a power supply 762, memory 764, a storage device 766, and a charge storage cellular network interface 767. The charge storage cellular phone 758 may include a WLAN interface 768 and associated antenna 769, a microphone 770, an audio output 772 such as a speaker and/or output jack, a display 774, and a user input device 776 such as a keypad and/or pointing device.

The phone control module 760 may receive input signals from the charge storage cellular network interface 767, the WLAN interface 768, the microphone 770, and/or the user input device 776. The phone control module 760 may process signals, including encoding, decoding, filtering, and/or formatting, and generate output signals. The output signals may be communicated to one or more of memory 764, the storage device 766, the charge storage cellular network interface 767, the WLAN interface 768, and the audio output 772.

Memory 764 may include random access memory (RAM) and/or nonvolatile memory such as flash memory, phase change memory, or multi-state memory, in which each memory charge storage cell has more than two states. The storage device 766 may include an optical storage drive, such as a DVD drive, and/or a hard disk drive (HDD). The power supply 762 provides power to the components of the charge storage cellular phone 758.

Referring now to FIG. 10F, the teachings of the disclosure can be implemented in memory 783 of a set top box 778. The set top box 778 includes a set top control module 780, a display 781, a power supply 782, memory 783, a storage device 784, and a WLAN interface 785 and associated antenna 786.

The set top control module 780 may receive input signals from the WLAN interface 785 and an external interface 787, which can send and receive information via cable, broadband Internet, and/or satellite. The set top control module 780 may process signals, including encoding, decoding, filtering, and/or formatting, and generate output signals. The output signals may include audio and/or video signals in standard and/or high definition formats. The output signals may be communicated to the WLAN interface 785 and/or to the display 781. The display 781 may include a television, a projector, and/or a monitor.

The power supply 782 provides power to the components of the set top box 778. Memory 783 may include random access memory (RAM) and/or nonvolatile memory such as flash memory, phase change memory, or multi-state memory, in which each memory charge storage cell has more than two states. The storage device 784 may include an optical storage drive, such as a DVD drive, and/or a hard disk drive (HDD).

Referring now to FIG. 10G, the teachings of the disclosure can be implemented in memory 792 of a media player 789. The media player 789 may include a media player control module 790, a power supply 791, memory 792, a storage device 793, a WLAN interface 794 and associated antenna 795, and an external interface 799.

The media player control module 790 may receive input signals from the WLAN interface 794 and/or the external interface 799. The external interface 799 may include USB, infrared, and/or Ethernet. The input signals may include compressed audio and/or video, and may be compliant with the MP3 format. Additionally, the media player control module 790 may receive input from a user input 796 such as a keypad, touchpad, or individual buttons. The media player control module 790 may process input signals, including encoding, decoding, filtering, and/or formatting, and generate output signals.

The media player control module 790 may output audio signals to an audio output 797 and video signals to a display 798. The audio output 797 may include a speaker and/or an output jack. The display 798 may present a graphical user interface, which may include menus, icons, etc. The power supply 791 provides power to the components of the media player 789. Memory 792 may include random access memory (RAM) and/or nonvolatile memory such as flash memory, phase change memory, or multi-state memory, in which each memory charge storage cell has more than two states. The storage device 793 may include an optical storage drive, such as a DVD drive, and/or a hard disk drive (HDD).

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A memory system comprising:
   charge storage cells having charge level decay that is based on lifetime erase operations performed on said charge storage cells; and
   a refresh control module that increases charge levels of said charge storage cells to offset said charge level decay without first erasing said charge storage cells,
   wherein said refresh control module increases charge levels of said charge storage cells in response to a read performed on said charge storage cells indicating that at least a predetermined amount of charge level drift has occurred.

2. The memory system of claim 1 wherein said refresh control module tests one of said charge storage cells to determine a current charge level decay characteristic.

3. The memory system of claim 1 further comprising nonvolatile memory that stores a count of lifetime erase operations performed on said charge storage cells, wherein said count is used to determine a charge level decay characteristic for at least one of said charge storage cells.

4. The memory system of claim 3 wherein said charge storage cells are divided into blocks and wherein said nonvolatile memory stores respective counts for each of said blocks.

5. The memory system of claim 3 further comprising a wear leveling module that distributes data writes substantially uniformly across said charge storage cells, wherein said count is a single count of lifetime erase operations used to determine said charge level decay characteristics for all of said charge storage cells.

6. The memory system of claim 1 wherein said refresh control module increases a charge level of one of said charge storage cells by iteratively programming and verifying said one of said charge storage cells.

7. The memory system of claim 1 further comprising a read/write module that programs said charge storage cells to M charge levels, wherein M is an integer greater than one.

8. The memory system of claim 7 wherein said read/write module programs one of said charge storage cells to one of said M charge levels by iteratively programming and verifying said one of said charge storage cells.

9. The memory system of claim 7 wherein said refresh control module increases a charge level of one of said charge storage cells by selecting a corresponding one of said M charge levels based on a current charge level of said one of said charge storage cells and instructing said read/write module to program said one of said charge storage cells to said one of said M charge levels.

10. The memory system of claim 9 wherein said read/write module iteratively programs and verifies said one of said charge storage cells to reach said one of said M charge levels.

11. The memory system of claim 7 wherein said read/write module iteratively programs and verifies one of said charge storage cells to reach one of said M charge levels.

12. The memory system of claim 1 wherein said refresh control module programs one of said charge storage cells with a first set of programming conditions, wherein said first set of programming conditions is based on a time since said one of said charge storage cells was last programmed and on a charge level decay characteristic of said one of said charge storage cells.

13. The memory system of claim 12 wherein said first set of programming conditions includes a programming time that is based on said time since said one of said charge storage cells was last programmed and on said charge level decay characteristic of said one of said charge storage cells.

14. The memory system of claim 1 further comprising a timer module that times a first period, wherein said refresh control module selectively increases a charge level of one of said charge storage cells when said first period expires.

15. The memory system of claim 14 wherein said first period is based on a count of lifetime erase operations performed on said one of said charge storage cells.

16. The memory system of claim 14 wherein said refresh control module tests one of said charge storage cells to determine a current charge level decay characteristic, and wherein said first period is based on said current charge level decay characteristic.

17. The memory system of claim 1 wherein said refresh control module increases charge levels of said charge storage cells when a refresh signal is received from a host.

18. The memory system of claim 17 wherein said refresh signal indicates (i) that said memory system is receiving power from an external power supply or (ii) that said memory system is about to be removed from said external power supply.

19. The memory system of claim 1 wherein said refresh control module increases charge levels of said charge storage cells when said memory system is idle.

20. The memory system of claim 1 wherein said refresh control module tracks which groups of said charge storage cells are currently erased, and omits increasing charge levels of said groups.

21. The memory system of claim 1 further comprising a read/write controller that erases a block of said charge storage cells including a first charge storage cell to erase said first charge storage cell.

22. A method of controlling a memory system, the method comprising:
- determining charge level decay of charge storage cells having charge level decay characteristics that are based on lifetime erase operations performed on said charge storage cells;
- increasing charge levels of said charge storage cells to offset said charge level decay without first erasing said charge storage cells;
- timing a first period; and
- selectively increasing said charge level of one of said charge storage cells in response to said first period expiring.

23. The method of claim 22 further comprising testing one of said charge storage cells to determine a current charge level decay characteristic.

24. The method of claim 22 further comprising storing a count of lifetime erase operations performed on said charge storage cells, wherein said count is used to determine a charge level decay characteristic of at least one of said charge storage cells.

25. The method of claim 24 wherein said charge storage cells are divided into blocks, and the method further comprises storing respective counts for each of said blocks.

26. The method of claim 24 further comprising distributing data writes substantially uniformly across said charge storage cells, wherein said count is a single count of lifetime erase operations used to determine said charge level decay characteristics for all of said charge storage cells.

27. The method of claim 22 further comprising increasing a charge level of one of said charge storage cells by iteratively programming and verifying said one of said charge storage cells.

28. The method of claim 22 further comprising programming said charge storage cells to M charge levels, wherein M is an integer greater than one.

29. The method of claim 28 further comprising programming one of said charge storage cells to one of said M charge levels by iteratively programming and verifying said one of said charge storage cells.

30. The method of claim 28 further comprising increasing a charge level of one of said charge storage cells by selecting a corresponding one of said M charge levels based on a current charge level of said one of said charge storage cells and programming said one of said charge storage cells to said one of said M charge levels.

31. The method of claim 30 further comprising iteratively programming and verifying said one of said charge storage cells to reach said one of said M charge levels.

32. The method of claim 28 further comprising iteratively programming and verifying one of said charge storage cells to reach one of said M charge levels.

33. The method of claim 22 further comprising programming one of said charge storage cells with a first set of programming conditions, wherein said first set of programming conditions is based on a time since said one of said charge storage cells was last programmed and on a charge level decay characteristic of said one of said charge storage cells.

34. The method of claim 33 wherein said first set of programming conditions includes a programming time that is based on said time since said one of said charge storage cells was last programmed and on said charge level decay characteristic of said one of said charge storage cells.

35. The method of claim 23 wherein said first period is based on a count of lifetime erase operations performed on said one of said charge storage cells.

36. The method of claim 23 further comprising testing one of said charge storage cells to determine a current charge level decay characteristic, wherein said first period is based on said current charge level decay characteristic.

37. The method of claim 22 further comprising increasing charge levels of said charge storage cells in response to a refresh signal being received from a host.

38. The method of claim 37 wherein said refresh signal indicates (i) that power is being received from an external power supply or (ii) that power is about to be removed from said external power supply.

39. The method of claim 22 further comprising increasing charge levels of said charge storage cells during idle periods.

40. The method of claim 22 further comprising increasing charge levels of said charge storage cells in response to a read performed on said charge storage cells indicating that at least a predetermined amount of charge level drift has occurred.

41. The method of claim 22 further comprising erasing a block of said charge storage cells including a first charge storage cell to erase said first charge storage cell.

42. A method of controlling a memory system, the method comprising:
- determining charge level decay of charge storage cells having charge level decay characteristics that are based on lifetime erase operations performed on said charge storage cells;
- increasing charge levels of said charge storage cells to offset said charge level decay without first erasing said charge storage cells;
- tracking which groups of said charge storage cells are currently erased; and
- omitting increasing charge levels of said groups.

* * * * *